US 8,192,916 B2

(12) United States Patent
Miyasaka et al.

(10) Patent No.: US 8,192,916 B2
(45) Date of Patent: Jun. 5, 2012

(54) PHOTOSENSITIVE RESIN COMPOSITION, PHOTOSENSITIVE ELEMENT, METHOD FOR FORMING RESIST PATTERN AND METHOD FOR PRODUCING PRINTED WIRING BOARD

(75) Inventors: Masahiro Miyasaka, Hitachi (JP); Takashi Kumaki, Hitachi (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

(21) Appl. No.: 12/837,998

(22) Filed: Jul. 16, 2010

(65) Prior Publication Data

US 2010/0285408 A1     Nov. 11, 2010

Related U.S. Application Data

(62) Division of application No. 11/915,169, filed as application No. PCT/JP2006/310134 on May 22, 2006, now Pat. No. 7,993,809.

(30) Foreign Application Priority Data

May 23, 2005   (JP) ................ P2005-150133
Apr. 6, 2006   (JP) ................ P2006-105416

(51) Int. Cl.
*G03F 7/00*     (2006.01)
*G03F 7/004*    (2006.01)

(52) U.S. Cl. ............ 430/270.1; 430/311; 430/905; 430/913; 430/915; 430/920; 430/945

(58) Field of Classification Search ............ 430/270.1, 430/311, 905, 913, 915, 920, 945
See application file for complete search history.

(56) References Cited

U.S. PATENT DOCUMENTS 4,845,011 A    7/1989   Wilczak et al.
(Continued)

FOREIGN PATENT DOCUMENTS

CN    1205784    1/1999
(Continued)

OTHER PUBLICATIONS

Chinese Official Action issued May 5, 2010, for Application No. 200680017652.X.

(Continued)

*Primary Examiner* — Amanda C. Walke
(74) *Attorney, Agent, or Firm* — Antonelli, Terry, Stout & Kraus, LLP.

(57) ABSTRACT

A photosensitive resin composition comprising: (A) a binder polymer; (B) a photopolymerizable compound that has an ethylenically unsaturated bond; and (C1) a compound represented by general formula (1) below, wherein, at least one R represents a $C_{1-10}$ alkoxy group or a $C_{1-12}$ alkyl group; the sum of a, b, and c is 1 to 6; and when the sum of a, b, and c is 2 to 6, each R may be the same as or different from one another.

16 Claims, 6 Drawing Sheets

U.S. PATENT DOCUMENTS

| | | |
|---|---|---|
| 5,221,595 A | 6/1993 | Lingnau et al. |
| 5,236,812 A | 8/1993 | Vassiliou et al. |
| 5,935,761 A | 8/1999 | Hwang et al. |
| 6,207,345 B1 | 3/2001 | Kimura et al. |
| 6,855,480 B2 | 2/2005 | Wheeler et al. |
| 7,338,751 B2 | 3/2008 | Akahori et al. |
| 2002/0018962 A1 | 2/2002 | Urano et al. |

FOREIGN PATENT DOCUMENTS

| | | |
|---|---|---|
| JP | 55-075405 | 6/1980 |
| JP | 4-223470 | 8/1992 |
| JP | 5-179226 | 7/1993 |
| JP | 2000-338659 | 12/2000 |
| JP | 2002-296764 | 10/2002 |
| JP | 2002-351070 | 12/2002 |
| JP | 2003-215799 | 7/2003 |
| JP | 2004-045596 | 2/2004 |
| JP | 2005-215142 | 8/2005 |
| TW | 557415 | 10/2003 |
| TW | 562997 | 11/2003 |

OTHER PUBLICATIONS

U.S. Office Action mailed Jul. 23, 2010, for U.S. Appl. No. 11/915,169.
U.S. Office Action mailed Aug. 5, 2011, for U.S. Appl. No. 12/838,025.
Japanese Official Action issued Feb. 9, 2010, for Application No. 2006-141895.
Korean Notice of Allowance issued Mar. 5, 2010, for Application No. 10-2009-7021746.
PENTAX Corporation, *PENTAX Press News*, "PENTAX DI-2080", Module substrate data direct imaging system, Product specifications sheet, pp. 1 and 2.
Taiwanese Official Action dated Dec. 9, 2009, for Application No. 095118300.
English language machine translation of JP 05-179226.
Search Report and Written Opinion dated Dec. 12, 2008, for Singapore Application No. 200717494-9, issued by the Austrian Patent Office.
Official Action issued on Aug. 26, 2008, in Application No. 10-2007-7023383.
Translation of the International Preliminary Report on Patentability for Application No. PCT/JP2006/310134, dated Dec. 6, 2007.

PHOTOSENSITIVE RESIN COMPOSITION, PHOTOSENSITIVE ELEMENT, METHOD FOR FORMING RESIST PATTERN AND METHOD FOR PRODUCING PRINTED WIRING BOARD

This application is a Divisional application of application Ser. No. 11/915,169, filed Nov. 21, 2007 now U.S. Pat. No. 7,993,809, the contents of which are incorporated herein by reference in their entirety. Ser. No. 11/915,169 is a National Stage application, filed under 35 USC 371, of International (PCT) Application No. PCT/JP2006/310134, filed May 22, 2006.

TECHNICAL FIELD

The present invention relates to a photosensitive resin composition, a photosensitive element, a method for forming a resist pattern, and a method for producing printed wiring boards.

BACKGROUND ART

Microelectronic circuits, as encountered with, for example, wiring boards for plasma displays, wiring boards for liquid-crystal displays, large-scale integrated circuits, thin transistors, semiconductor packages, and so forth, are typically produced through a process known as photolithography that involves the formation of a resist pattern. In photolithography, a conductor pattern is formed on a substrate, for example, as follows. A photosensitive layer disposed on the substrate is first exposed to light, for example, ultraviolet radiation, through a mask film bearing a prescribed pattern. A resist pattern is then formed by development with a developing solution in which the exposed regions and unexposed regions have different solubilities. Then a conductor pattern is formed on the substrate, for example, by a plating step or an etching step, using this resist pattern as a mask.

The development of technology that enables even higher densities for the wiring of electronic circuits is being actively pursued in particular in the surface mounting technology sector, for example, in connection with printed wiring boards, semiconductor packages, and so forth. There is demand in this sector that the conductor pattern constituting the wiring be formed on the scale of 10 μm or less. The photosensitive resin composition used in photolithography must therefore provide resolution on the scale of 10 μm or less.

Ever higher sensitivities are also being required of the photosensitive resin composition. Escalating wiring densities have a tendency to bring out the problem of a voltage drop due to the resistance of the power lines. An effective response to this problem is to thicken the conductor layer that forms the wiring to at least about 10 μm by increasing the film thickness of the resist pattern. Additional increases in sensitivity are then required of the photosensitive resin in order to be able to form the thicker resist patterns at high productivities.

On the other hand, the procedure known as direct imaging exposure, in which the resist pattern is directly imaged without the use of a mask pattern, is receiving attention within the sphere of methods for forming resist patterns. Direct imaging exposure is believed to have the capacity to form resist patterns at high resolutions and high productivities. Moreover, the application of a long-life, high-output gallium nitride-type blue laser light source, i.e., laser light emission at a wavelength of 405 nm, as a practical light source has become more and more possible in recent years. The use of such short wavelength laser light in direct imaging exposure is expected to make possible the formation of high density resist patterns that have heretofore been difficult to produce. A method that applies the Digital Light Processing (DLP) system championed by Texas Instruments has been proposed by Ball Semiconductor Inc., and the practical application of photoexposure devices that use this method has already begun.

Moreover, there have already been a few disclosures with regard to photosensitive resin compositions intended for the formation of resist patterns by direct imaging exposure using a laser, such as the blue laser cited above, as the active light (for example, refer to Japanese Patent Application Laid-open Nos. 2002-296764 and 2004-45596).

DISCLOSURE OF THE INVENTION

However, the existing photosensitive resin compositions are still unsatisfactory with regard to sensitivity and resolution when employed for the formation of high-density resist patterns by direct imaging exposure.

An object of the present invention is the introduction of a photosensitive resin composition that enables resist pattern formation to be carried out by direct imaging exposure at a satisfactory sensitivity and a satisfactory resolution. Additional objects of the present invention are the introduction of a photosensitive element that uses this photosensitive resin composition, the introduction of a method of resist pattern formation that uses this photosensitive resin composition, and the introduction of a method for producing printed wiring boards that uses this photosensitive resin composition.

In order to achieve these objects, the present invention provides a photosensitive resin composition comprising: (A) a binder polymer; (B) a photopolymerizable compound that has an ethylenically unsaturated bond; and (C1) a compound represented by general formula (1) below.

[Chemical formula 1]

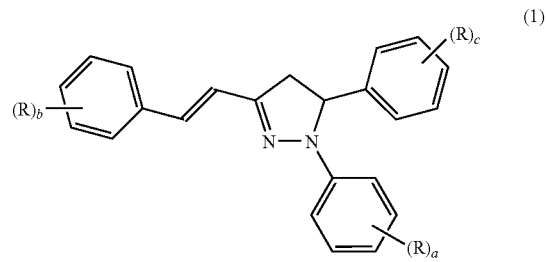

In formula (1), at least one R represents a $C_{1-10}$ alkoxy group or a $C_{1-12}$ alkyl group; the sum of a, b, and c is 1 to 6; and when the sum of a, b, and c is 2 to 6, each R may be the same as or different from one another.

The photosensitive resin composition of the present invention, because it comprises the combination of the specific components cited above, enables resist pattern formation to be carried out by direct imaging exposure at a satisfactory sensitivity and a satisfactory resolution. The present inventors believe that these results, i.e., an improved sensitivity and an improved resolution, are obtained due to the use of a photopolymerization initiator comprising a pyrazoline derivative that has specific substituents as cited for component (C1).

a, b, and c in component (C1) in the photosensitive resin composition of the present invention are preferably each integers from 0 to 2.

Component (A) in the photosensitive resin composition of the present invention preferably comprises an acrylic-type polymer that has as constituent units thereof a monomer unit derived from acrylic acid and/or methacrylic acid and a monomer unit derived from alkyl ester of acrylic acid and/or alkyl ester of methacrylic acid. This provides additional improvements in the alkali developability and post-exposure resist strippability.

In addition to the preceding components, the photosensitive resin composition of the present invention preferably further comprises, as a component (C2), a 2,4,5-triarylimidazole dimer or a derivative thereof. Like component (C1), this component (C2) also functions as a photopolymerization initiator. The co-use of components (C1) and (C2) as the photopolymerization initiator provides an additional synergistic increase in the sensitivity and resolution and also increases the adhesiveness for substrate.

The photosensitive resin composition of the present invention preferably contains component (B) at 20 to 80 mass parts per 100 mass parts of the total content of components (A) and (B) and component (C1) at 0.001 to 5.0 mass parts per 100 mass parts of the total content of components (A) and (B).

When R in the compound represented by general formula (1), supra, represents a $C_{1-10}$ alkoxy group or a $C_{1-3}$ alkyl group, this R is preferably a methoxy group and/or an isopropyl group and the sum of a, b, and c is preferably 1 or 2.

In addition, when R in the compound represented by general formula (1), supra, represents a $C_{4-12}$ alkyl group, this R is preferably at least one alkyl group selected from the group consisting of an n-butyl group, a tert-butyl group, a tert-octyl group, and a dodecyl group. The pyrazoline derivatives having these substituents provide a clearly satisfactory sensitivity and resolution for the photosensitive resin composition.

The photosensitive resin composition of the present invention is preferably used to form a resist pattern by exposure to light having a peak in the wavelength range from at least 350 nm to less than 440 nm and particularly preferably is used to form a resist pattern by exposure to light having a peak in the wavelength range from at least 390 nm to less than 410 nm. High-density resist patterns can be easily formed by, for example, the application of direct imaging exposure using light having a peak within the wavelength range from at least 350 nm to less than 440 nm as the active light. The photosensitive resin composition of the present invention is particularly useful for resist pattern formation using light with these specific wavelengths.

Here, the phrase "having a peak" means that the intensity of the light exhibits a maximum value in the prescribed wavelength range.

The component (C1) used in the photosensitive resin composition of the present invention preferably has a wavelength of maximum absorption of from at least 370 nm to less than 420 nm. This "wavelength of maximum absorption" denotes the wavelength at which the absorbance achieves its highest value. One means for obtaining a photosensitive resin composition suitable for the aforementioned direct imaging exposure using the components present in conventional photosensitive resin compositions comprises simply increasing the addition of the photopolymerization initiator in order to increase the absorbance over all wavelengths, thereby securing the sensitivity by also raising the absorbance for light having a peak in the wavelength range from at least 390 nm to less than 440 nm. However, conventional photosensitive resin compositions that contain 4,4'-bis(diethylamino)benzophenone as initiator have a wavelength of maximum absorption around 365 nm. Due to this, light having a peak in the wavelength range from at least 390 nm to less than 440 nm is located at the foot or fringe of the absorbance peak (wavelength of maximum absorption: 365 nm) of such a photosensitive resin composition. This results in a large change in sensitivity for a shift of approximately several nm in the wavelength of the irradiated light. On the other hand, the laser light used, for example, in direct imaging exposure, exhibits a wavelength distribution to a certain degree, and an oscillation width of approximately several nm can occur in the wavelength at the time of irradiation. Given this, the stability or consistency of the sensitivity will tend to be reduced in those cases where nothing more than a simple increase in the addition of the photopolymerization initiator has been carried out.

However, because the wavelength of maximum absorption of component (C1) lies from at least 370 nm to less than 420 nm, the photosensitive resin composition of the present invention as described above, when subjected to exposure by light having a peak in the wavelength range from at least 350 nm to less than 440 nm, is able to thoroughly inhibit the changes in sensitivity that occur even when the wavelength of the absorbed light shifts by approximately several nm. This enables a substantially better response even in the face of shifts of approximately several nm in the wavelength of the irradiated light.

When the wavelength of maximum absorption by component (C1) is less than 370 nm, the sensitivity for light having a peak in the wavelength range from at least 390 nm to less than 440 nm (for example, laser light at 405 nm) tends to decline, and when the wavelength of maximum absorption is 420 nm or more, the stability under yellow light ambients tends to decline.

The present invention provides a photosensitive element comprising a support and a photosensitive layer that is disposed on said support and that comprises the hereinabove-described photosensitive resin composition of the present invention. This photosensitive element, because it has the hereinabove-described photosensitive resin composition of the present invention disposed on it as a photosensitive layer, can carry out resist pattern formation by direct imaging exposure at a satisfactory sensitivity and a satisfactory resolution. This photosensitive element is therefore well qualified, for example, for the production of a printed wiring board that carries a high-density wiring pattern.

The present invention provides a method of forming a resist pattern, comprising: a photosensitive layer forming step of forming a photosensitive layer comprising the above-described photosensitive resin composition on a substrate; an exposing step of exposing prescribed regions of the photosensitive layer to light that has a peak in the wavelength range from at least 350 nm to less than 440 nm; and a developing step of developing the exposed photosensitive layer to form a resist pattern. The present invention also provides a method of producing a printed wiring board, comprising the steps cited above and a conductor pattern forming step of forming a conductor pattern on the substrate based on the resist pattern that has been formed.

The method of the present invention for forming a resist pattern preferably comprises: a photosensitive layer forming step of forming a photosensitive layer comprising the above-described photosensitive resin composition on a substrate; an exposing step of exposing prescribed regions of the photosensitive layer to light that has a peak in the wavelength range from at least 350 nm to less than 440 nm; and a developing step of developing the exposed photosensitive layer to form a resist pattern. The present invention also provides a method of producing a printed wiring board, comprising the steps cited above and a conductor pattern forming step of forming a conductor pattern on the substrate based on the resist pattern that has been formed.

The above-described method for forming a resist pattern and the above-described method of producing a printed wiring board, because they employ the photosensitive resin composition of the present invention, are able to produce a high-density resist pattern or conductor pattern on a substrate at high productivities.

The present invention provides a photosensitive resin composition that enables resist pattern formation to be carried out by direct imaging exposure at a satisfactory sensitivity and a satisfactory resolution. The present invention also provides a photosensitive element that uses this photosensitive resin composition, a method of resist pattern formation that uses this photosensitive resin composition, and a method for producing printed wiring boards that uses this photosensitive resin composition.

DESCRIPTION OF THE REFERENCE SYMBOLS

Figure 1:
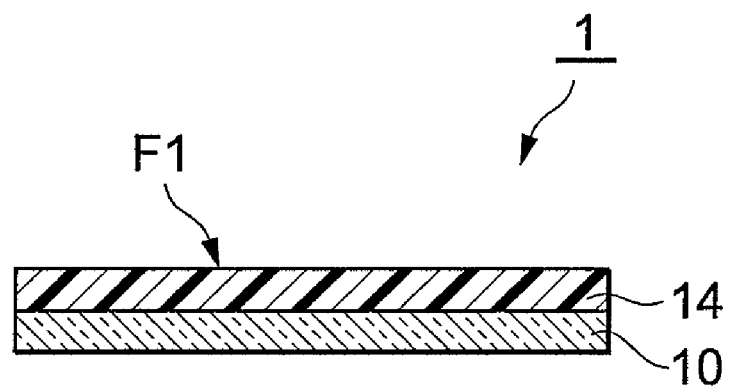
FIG. 1 shows an embodiment of the photosensitive element according to the present invention in schematic cross section.

1 . . . photosensitive element
10 . . . support
14 . . . photosensitive layer

BEST MODE FOR CARRYING OUT THE INVENTION

Suitable embodiments of the present invention are described in detail hereinbelow, as necessary with reference to the figures. The same reference symbols are assigned to the same elements throughout the figures and redundant descriptions have been omitted. Positional relationships, such as top and bottom, left and right, and so forth, are based on the positional relationships shown in the figures, unless stated otherwise. In addition, the dimensional ratios depicted in the figures are not limited to the graphically represented ratios. In this Description, "(meth)acrylic acid" denotes "acrylic acid" and the "methacrylic acid" corresponding thereto; "(meth) acrylate" denotes "acrylate" and the "methacrylate" corresponding thereto; the "(meth)acryloxy group" denotes the "acryloxy group" and the "methacryloxy group" corresponding thereto; and the "(meth)acryloyl group" denotes the "acryloyl group" and the "methacryloyl group" corresponding thereto.

The photosensitive resin composition of the present embodiment comprises (A) a binder polymer, (B) a photopolymerizable compound that contains an ethylenically unsaturated bond, and (C1) a pyrazoline derivative as represented by the preceding general formula (1).

There are no particular limitations on the component (A) binder polymer as long as it is a polymer that enables the uniform dissolution or dispersion of the other components of the resin composition. Component (A) can be exemplified by acrylic-type resins, styrenic resins, epoxy-type resins, amide-type resins, amidoepoxy-type resins, alkyd-type resins, phenolic resins, and so forth. A single one of these may be used as component (A) or two or more may be used in combination as component (A). Among these, the presence of an acrylic-type polymer in component (A) is preferred from the standpoint of obtaining an excellent alkali developability and an excellent resist strippability after irradiation with light. This acrylic-type polymer more preferably contains as constituent units thereof both a monomer unit derived from acrylic acid and/or methacrylic acid and a monomer unit derived from alkyl acrylates and/or alkyl methacrylates. Here, "acrylic-type polymer" denotes a polymer that contains primarily monomer units derived from (meth)acrylic group-containing polymerizable monomer.

The aforementioned acrylic-type polymer may be produced, for example, by the radical polymerization of (meth) acrylic group-containing polymerizable monomer. This (meth)acrylic group-containing polymerizable monomer can be exemplified by acrylamide, acrylonitrile, alkyl(meth)acrylates, tetrahydrofurfuryl(meth)acrylate, dimethylaminoethyl (meth)acrylate, diethylaminoethyl(meth)acrylate, glycidyl (meth)acrylate, 2,2,2-trifluoroethyl(meth)acrylate, 2,2,3,3-tetrafluoropropyl(meth)acrylate, (meth)acrylic acid, α-bromo(meth)acrylic acid, α-chloro(meth)acrylic acid, β-furyl(meth)acrylic acid, β-styryl(meth)acrylic acid, and so forth. A single one of these may be employed as the polymerizable monomer or two or more may be used in combination as the polymerizable monomer. The alkyl(meth)acrylates cited above can be exemplified by methyl(meth)acrylate, ethyl(meth)acrylate, propyl(meth)acrylate, butyl(meth)acrylate, pentyl(meth)acrylate, hexyl(meth)acrylate, heptyl(meth) acrylate, octyl(meth)acrylate, 2-ethylhexyl(meth)acrylate, and structural isomers of the preceding. A single one of these polymerizable monomers may be used or two or more can be used in combination.

In addition to the (meth)acrylic group-containing polymerizable monomer cited above, a single polymerizable monomer or two or more polymerizable monomers, as exemplified by styrene, polymerizable styrene derivatives e.g., vinyltoluene, α-methylstyrene, p-methylstyrene, p-ethylstyrene, and so forth, esters of vinyl alcohol such as vinyl n-butyl ether, maleic acid, maleic anhydride, maleate monoesters e.g., monomethyl maleate, monoethyl maleate, monoisopropyl maleate and so forth, fumaric acid, cinnamic acid, α-cyanocinnamic acid, itaconic acid, crotonic acid, propionic acid, and so forth, may also be copolymerized in the acrylic-type polymer.

The binder polymer preferably contains the carboxyl group in order to provide binder polymer that has a particularly good alkali developability. This carboxyl group-containing binder polymer can be exemplified by the acrylic-type polymer described above that has a carboxyl group-containing polymerizable monomer (preferably methacrylic acid) as a monomer unit.

When the binder polymer contains the carboxyl group, its acid number is preferably 30 to 200 mg KOH/g and more preferably is 45 to 150 mg KOH/g. The developing time tends to grow longer when the acid number is less than 30 mg KOH/g; the post-exposure resistance of the photocured photosensitive layer to the developing solution tends to decline when the acid number exceeds 200 mg KOH/g.

The binder polymer preferably contains styrene or a styrene derivative as a monomer unit from the standpoint of obtaining binder polymer that exhibits both an excellent adhesiveness and excellent stripping characteristics. The binder polymer preferably contains, with reference to the binder polymer as a whole, from 3 to 30 mass %, more preferably from 4 to 28 mass %, and even more preferably 5 to 27 mass % styrene or styrene derivative. The adhesiveness tends to deteriorate when this content is less than 3 mass % and there is a tendency for the stripped fragments to be large and for the stripping time to lengthen when this content exceeds 30 mass %. A preferred example of binder polymer having styrene or a styrene derivative as a monomer unit is the acrylic-type polymer described above in which styrene or a styrene derivative is copolymerized along with (meth)acrylic group-containing polymerizable monomer.

The binder polymer may as necessary also have a photosensitive group, for example, an ethylenically unsaturated bond.

The binder polymer has a dispersity (weight-average molecular weight/number average molecular weight) preferably of 1.0 to 3.0 and more preferably of 1.0 to 2.0. The adhesiveness and resolution tend to decline when the dispersity exceeds 3.0. The weight-average molecular weight and number-average molecular weight are measured in this embodiment by gel permeation chromatography (GPC) and are the values based on the use of polystyrene standards as the calibrating standards.

The weight-average molecular weight (value measured by gel permeation chromatography (GPC) based on polystyrene standards) of the binder polymer is preferably 5000 to 300000, more preferably 40000 to 150000, and particularly preferably 45000 to 80000. The resistance to the developing solution tends to decline when the number-average molecular weight is less than 5000, while the developing time tends to lengthen when the number-average molecular weight exceeds 300000.

The binder polymer may be constituted of only a single polymer or may be constituted of a combination of two or more polymers. Combinations of two or more polymers can be exemplified by combinations of two or more copolymers that contain different copolymerized components, combinations of two or more polymers that have different weight-average molecular weights, combinations of two or more polymers that have different dispersities, and so forth. Polymer having a multimode molecular weight distribution, as described in Japanese Patent Application Laid-open No. H 11-327137, can also be used as the binder polymer.

The blending proportion of the component (A) binder polymer in the photosensitive resin composition is preferably 20 to 80 mass parts, more preferably 30 to 70 mass parts, and even more preferably 40 to 60 mass parts, in each case per 100 mass parts of the total of component (A) and the component (B) described below. When this blending proportion is less than 20 mass parts, the region cured by photoexposure of the photosensitive resin composition layer comprising the photosensitive resin composition is more readily susceptible to embrittlement than when this blending proportion is within the aforementioned range; the coatability also tends to be inferior in the case of application as a photosensitive element. The photosensitivity tends to be unsatisfactory when this blending proportion exceeds 80 mass parts as compared to a blending proportion in the aforementioned range.

Component (B), a photopolymerizable compound that has an ethylenically unsaturated bond, may be any photopolymerizable compound that contains at least one ethylenically unsaturated bond. In particular, the combination of a monofunctional photopolymerizable compound that has one ethylenically unsaturated bond with a multifunctional photopolymerizable compound that has at least two ethylenically unsaturated bonds is preferably used as component (B).

The ethylenically unsaturated bond carried by component (B) is not particularly restricted as long as it is photopolymerizable and can be exemplified by α,β-unsaturated carbonyl groups such as the (meth)acrylate group and so forth. Photopolymerizable compounds that have an α,β-unsaturated carbonyl group as the ethylenically unsaturated bond can be exemplified by the α,β-unsaturated carboxylic acid esters of polyvalent alcohols, (meth)acrylate compounds that contain the bisphenol A skeleton, adducts between glycidyl-functional compounds and α,β-unsaturated carboxylic acids, urethane bond-containing (meth)acrylate compounds, nonylphenoxypolyethyleneoxyacrylates, (meth)acrylate compounds that contain the phthalic acid skeleton, alkyl (meth)acrylate esters, and so forth. A single one of these may be used or two or more of these may be used in combination. Viewed from the perspective of the adhesiveness and resistance to plating, preferred thereamong are (meth)acrylate compounds that contain the bisphenol A skeleton and urethane bond-containing (meth)acrylate compounds wherein (meth)acrylate compounds that contain the bisphenol A skeleton are particularly preferred.

The esters of polyvalent alcohols with α,β-unsaturated carboxylic acids can be exemplified by polyethylene glycol di(meth)acrylates that have from 2 to 14 ethylene groups, polypropylene glycol di(meth)acrylates that have from 2 to 14 propylene groups, polyethylene•polypropylene glycol di(meth)acrylates that have from 2 to 14 ethylene groups and from 2 to 14 propylene groups, trimethylolpropane di(meth)acrylate, trimethylolpropane tri(meth)acrylate, EO-modified trimethylolpropane tri(meth)acrylate, PO-modified trimethylolpropane tri(meth)acrylate, EO-+PO-modified trimethylolpropane tri(meth)acrylate, tetramethylolmethane tri(meth)acrylate, tetramethylolmethane tetra(meth)acrylate, dipentaerythritol penta(meth)acrylate, dipentaerythritol hexa(meth)acrylate, and so forth. A single one of these may be used or two or more may be used in combination. With regard to the preceding compound names, "EO-modified" indicates a compound that has a block structure formed by the ethylene oxide group, while "PO-modified" indicates a compound that has a block structure formed by the propylene oxide group.

The (meth)acrylate compound that contains the bisphenol skeleton is not particularly limited as long as it contains the bisphenol A skeleton (the structure yielded by removing the hydrogen atoms from the two phenolic hydroxyl groups of bisphenol A) and contains the methacrylate group or the acrylate group or both the methacrylate group and the acrylate group. Specific examples are 2,2-bis(4-((meth)acryloxypolyethoxy)phenyl)propane, 2,2-bis(4-((meth)acryloxypolypropoxy)phenyl)propane, 2,2-bis(4-((meth)acryloxypolybutoxy)phenyl)propane, 2,2-bis(4-((meth)acryloxypolyethoxypolypropoxy)phenyl)propane, and so forth.

The 2,2-bis(4-((meth)acryloxypolyethoxy)phenyl)propane preferably contains from 4 to 20 ethylene oxide groups and more preferably contains from 8 to 15 ethylene oxide groups. The 2,2-bis(4-((meth)acryloxypolyethoxy)phenyl)propane can be specifically exemplified by 2,2-bis(4-((meth)acryloxydiethoxy)phenyl)propane, 2,2-bis(4-((meth)acryloxytriethoxy)phenyl)propane, 2,2-bis(4-((meth)acryloxytetraethoxy)phenyl)propane, 2,2-bis(4-((meth)acryloxypentaethoxy)phenyl)propane, 2,2-bis(4-((meth)acryloxyhexaethoxy)phenyl)propane, 2,2-bis(4-((meth)acryloxyheptaethoxy)phenyl)propane, 2,2-bis(4-((meth)acryloxyoctaethoxy)phenyl)propane, 2,2-bis(4-((meth)acryloxynonaethoxy)phenyl)propane, 2,2-bis(4-((meth)acryloxydecaethoxy)phenyl)propane, 2,2-bis(4-((meth)acryloxyundecaethoxy)phenyl)propane, 2,2-bis(4-((meth)

acryloxydodecaethoxy)phenyl)propane, 2,2-bis(4-((meth)acryloxytridecaethoxy)phenyl)propane, 2,2-bis(4-((meth)acryloxytetradecaethoxy)phenyl)propane, 2,2-bis(4-((meth)acryloxypentadecaethoxy)phenyl)propane, 2,2-bis(4-((meth)acryloxyhexadecaethoxy)phenyl)propane, and so forth.

Among the preceding compounds, 2,2-bis(4-(methacryloxypentaethoxy)phenyl)propane can be acquired commercially as "BPE-500" (product name, Shin-nakamura Chemical Co., Ltd.). In addition, 2,2-bis(4-(methacryloxypentadecaethoxy)phenyl)propane can be acquired commercially as "BPE-1300" (product name, Shin-nakamura Chemical Co., Ltd.).

The urethane bond-containing (meth)acrylate compounds can be exemplified by the adducts of (meth)acrylic monomer having OH in the β-position with a diisocyanate compound (e.g., isophorone diisocyanate, 2,6-toluene diisocyanate, 2,4-toluene diisocyanate, 1,6-hexamethylene diisocyanate, and so forth), and by tris((meth)acryloxytetraethylene glycol isocyanate)hexamethylene isocyanurate, EO-modified urethane di(meth)acrylate, EO-+PO-modified urethane di(meth)acrylate, and so forth. "UA-11" (product name, Shin-nakamura Chemical Co., Ltd.) is an example of a commercially available EO-modified urethane di(meth)acrylate. "UA-13" (product name, Shin-nakamura Chemical Co., Ltd.) is an example of a commercially available EO-+PO-modified urethane di(meth)acrylate. A single one of these can be used or two or more can be used in combination.

The nonylphenoxypolyethyleneoxyacrylate can be exemplified by nonylphenoxytetraethyleneoxyacrylate, nonylphenoxypentaethyleneoxyacrylate, nonylphenoxyhexaethyleneoxyacrylate, nonylphenoxyheptaethyleneoxyacrylate, nonylphenoxyoctaethyleneoxyacrylate, nonylphenoxynonaethyleneoxyacrylate, nonylphenoxydecaethyleneoxyacrylate, and nonylphenoxyundecaethyleneoxyacrylate. A single one of these can be used or two or more can be used in combination.

The above-cited (meth)acrylate compound that contains the phthalic acid skeleton is not particularly limited as long as it contains the phthalic acid skeleton (the structure given by removing the hydrogen atoms from the two carboxyl groups of phthalic acid) and contains the methacrylate group or the acrylate group or both the methacrylate group and the acrylate group. Specific examples thereof are γ-chloro-β-hydroxypropyl-β'-(meth)acryloyloxyethyl-o-phthalate, β-hydroxyalkyl-β'-(meth)acryloxyloxyalkyl-o-phthalate, and so forth.

The blending proportion for the component (B) photopolymerizable compound that has an ethylenically unsaturated bond is preferably 20 to 80 mass parts, more preferably 30 to 70 mass parts, and even more preferably 40 to 60 mass parts, in each case per 100 mass parts of the total of components (A) and (B). When this blending proportion is less than 20 mass parts, the photosensitivity tends to be unsatisfactory as compared to a blending proportion within the aforementioned range and when this blending proportion exceeds 80 mass parts, the photocured regions tend to be more susceptible to embrittlement than when this blending proportion is within the aforementioned range.

The pyrazoline derivative comprising component (C1) is represented by general formula (1), supra, but is not otherwise particularly limited. In formula (1), at least one R represents $C_{1-10}$ alkoxy or $C_{1-12}$ alkyl; the sum of a, b, and c is 1 to 6; and when the sum of a, b, and c is 2 to 6, each R may be the same as or different from one another.

The R's in component (C1) may be straight chain or may be branched. R can be exemplified by methoxy, isopropyl, n-butyl, tert-butyl, tert-octyl, and dodecyl, but is not limited to the preceding. The sum of a, b, and c in general formula (1) is preferably 1 to 6, more preferably 1 to 4, and particularly preferably 1 or 2.

From the perspective of bringing about additional improvements in the sensitivity and solubility, pyrazoline derivatives are preferred within the range available to component (C1) in which R is $C_{1-10}$ alkoxy or $C_{1-3}$ alkyl. Moreover, 1-phenyl-3-(4-methoxystyryl)-5-(4-methoxyphenyl)-pyrazoline is particularly preferred from the perspective of ease of synthesis and bringing about an increased sensitivity, while 1-phenyl-3-(4-isopropylstyryl)-5-(4-isopropylphenyl)-pyrazoline is particularly preferred from the perspective of ease of synthesis and bringing about an additional increase in solubility.

From the standpoint of more reliably obtaining a satisfactory photosensitivity and resolution when the photosensitive resin composition of the present invention is used in direct imaging exposure, the wavelength of maximum absorption for component (C1) is preferably from at least 370 nm to less than 420 nm and more preferably is from at least 380 nm to less than 400 nm.

The pyrazoline derivative (C1) can be exemplified by 1-(4-methoxyphenyl)-3-styryl-5-phenylpyrazoline, 1-phenyl-3-(4-methoxystyryl)-5-(4-methoxyphenyl)pyrazoline, 1,5-bis-(4-methoxyphenyl)-3-(4-methoxystyryl)pyrazoline, 1-(4-isopropylphenyl)-3-styryl-5-phenylpyrazoline, 1-phenyl-3-(4-isopropylstyryl)-5-(4-isopropylphenyl)pyrazoline, 1,5-bis-(4-isopropylphenyl)-3-(4-isopropylstyryl)pyrazoline, 1-(4-methoxyphenyl)-3-(4-tert-butylstyryl)-5-(4-tert-butylphenyl)pyrazoline, 1-(4-tert-butylphenyl)-3-(4-methoxystyryl)-5-(4-methoxyphenyl)pyrazoline, 1-(4-isopropylphenyl)-3-(4-tert-butylstyryl)-5-(4-tert-butylphenyl)pyrazoline, 1-(4-tert-butylphenyl)-3-(4-isopropylstyryl)-5-(4-isopropylphenyl)pyrazoline, 1-(4-methoxyphenyl)-3-(4-isopropylstyryl)-5-(4-isopropylphenyl)pyrazoline, 1-(4-isopropylphenyl)-3-(4-methoxystyryl)-5-(4-methoxyphenyl)pyrazoline, 1-phenyl-3-(3,5-dimethoxystyryl)-5-(3,5-dimethoxyphenyl)pyrazoline, 1-phenyl-3-(3,4-dimethoxystyryl)-5-(3,4-dimethoxyphenyl)pyrazoline, 1-phenyl-3-(2,6-dimethoxystyryl)-5-(2,6-dimethoxyphenyl)pyrazoline, 1-phenyl-3-(2,5-dimethoxystyryl)-5-(2,5-dimethoxyphenyl)pyrazoline, 1-phenyl-3-(2,3-dimethoxystyryl)-5-(2,3-dimethoxyphenyl)pyrazoline, 1-phenyl-3-(2,4-dimethoxystyryl)-5-(2,4-dimethoxyphenyl)pyrazoline, 1-(4-methoxyphenyl)-3-(3,5-dimethoxystyryl)-5-(3,5-dimethoxyphenyl)pyrazoline, 1-(4-methoxyphenyl)-3-(3,4-dimethoxystryl)-5-(3,4-dimethoxyphenyl)pyrazoline, 1-(4-methoxyphenyl)-3-(2,6-dimethoxystyryl)-5-(2,6-dimethoxyphenyl)pyrazoline, 1-(4-methoxyphenyl)-3-(2,5-dimethoxystyryl)-5-(2,5-dimethoxyphenyl)pyrazoline, 1-(4-methoxyphenyl)-3-(2,3-dimethoxystyryl)-5-(2,3-dimethoxyphenyl)pyrazoline, 1-(4-methoxyphenyl)-3-(2,4-dimethoxystyryl)-5-(2,4-dimethoxyphenyl)pyrazoline, 1-(4-tert-butylphenyl)-3-(3,5-dimethoxystyryl)-5-(3,5-dimethoxyphenyl)pyrazoline, 1-(4-tert-butylphenyl)-3-(3,4-dimethoxystyryl)-5-(3,4-dimethoxyphenyl)pyrazoline, 1-(4-tert-butylphenyl)-3-(2,6-dimethoxystyryl)-5-(2,6-dimethoxyphenyl)pyrazoline, 1-(4-tert-butylphenyl)-3-(2,5-dimethoxystyryl)-5-(2,5-dimethoxyphenyl)pyrazoline, 1-(4-tert-butylphenyl)-3-(2,3-dimethoxystyryl)-5-(2,3-dimethoxyphenyl)pyrazoline, 1-(4-tert-butylphenyl)-3-(2,4-dimethoxystyryl)-5-(2,4-dimethoxyphenyl)pyrazoline, 1-(4-isopropylphenyl)-3-(3,5-dimethoxystyryl)-5-(3,5-dimethoxyphenyl)pyrazoline, 1-(4-isopropylphenyl)-3-(3,4-dimethoxystyryl)-5-(3,4-dimethoxyphenyl)pyrazoline, 1-(4-isopropylphenyl)-3-(2,6-dimethoxystyryl)-5-(2,6-dimethoxyphenyl)pyrazoline, 1-(4-isopropylphenyl)-3-(2,5-dimethoxystyryl)-5-(2,5- dimethoxyphenyl)pyrazoline, 1-(4-isopropylphenyl)-3-(2,3-dimethoxystyryl)-5-(2,3-dimethoxyphenyl)pyrazoline, 1-(4-isopropylphenyl)-3-(2,4-dimethoxystyryl)-5-(2,4-dimethoxyphenyl)pyrazoline, 1-(4-tert-butylphenyl)-3-styryl-5-phenylpyrazoline, 1-phenyl-3-(4-tert-butylstyryl)-5-(4-tert-butylphenyl)pyrazoline, 1,5-bis(4-tert-butylphenyl)-3-(4-tert-butylstyryl)pyrazoline, 1-(4-tert-octylphenyl)-3-styryl-5-phenylpyrazoline, 1-phenyl-3-(4-tert-octylstyryl)-5-(4-tert-octylphenyl)pyrazoline, 1,5-bis(4-tert-octylphenyl)-3-(4-tert-octylstyryl)pyrazoline, 1-(4-dodecylphenyl)-3-styryl-5-phenylpyrazoline, 1-phenyl-3-(4-dodecylstyryl)-5-(4-dodecylphenyl)pyrazoline, 1-(4-dodecylphenyl)-3-(4-dodecylstyryl)-5-(4-dodecylphenyl)pyrazoline, 1-(4-tert-octylphenyl)-3-(4-tert-butylstyryl)-5-(4-tert-butylphenyl)pyrazoline, 1-(4-tert-butylphenyl)-3-(4-tert-octylstyryl)-5-(4-tert-octylphenyl)pyrazoline, 1-(4-dodecylphenyl)-3-(4-tert-butylstyryl)-5-(4-tert-butylphenyl)pyrazoline, 1-(4-tertbutylphenyl)-3-(4-dodecylstyryl)-5-(4-dodecylphenyl)pyrazoline, 1-(4-dodecylphenyl)-3-(4-tert-octylstyryl)-5-(4-tert-octylphenyl)pyrazoline, 1-(4-tert-octylphenyl)-3-(4-dodecylstyryl)-5-(4-dodecylphenyl)pyrazoline, 1-(2,4-di-n-butylphenyl)-3-(4-dodecylstyryl)-5-(4-dodecylphenyl)pyrazoline, 1-phenyl-3-(3,5-di-tert-butylstyryl)-5-(3,5-di-tert-butylphenyl)pyrazoline, 1-phenyl-3-(2,6-di-tert-butylstyryl)-5-(2,6-di-tert-butylphenyl)pyrazoline, 1-phenyl-3-(2,5-di-tert-butylstyryl)-5-(2,5-di-tert-butylphenyl)pyrazoline, 1-phenyl-3-(2,6-di-n-butylstyryl)-5-(2,6-di-n-butylphenyl)pyrazoline, 1-(3,4-di-tert-butylphenyl)-3-styryl-5-phenylpyrazoline, 1-(3,5-di-tert-butylphenyl)-3-styryl-5-phenylpyrazoline, 1-(4-tert-butylphenyl)-3-(3,5-di-tert-butylstyryl)-5-(3,5-di-tert-butylphenyl)pyrazoline, and 1-(3,5-di-tert-butylphenyl)-3-(3,5-di-tert-butylstyryl)-5-(3,5-di-tert-butylphenyl)pyrazoline.

A single component (C1) may be used or two or more components (C1) may be used in combination.

The blending proportion for component (C1) is preferably 0.001 to 5.0 mass parts, more preferably 0.05 to 0.8 mass part, even more preferably 0.01 to 2.0 mass parts, particularly preferably 0.1 to 0.5 mass part, and very preferably 0.2 to 0.4 mass part, in each case per 100 mass parts of the total of components (A) and (B). Achieving both a satisfactory photosensitivity and a satisfactory resolution tends to be more problematic when the component (C1) blending proportion is outside the range cited above than when this blending proportion is within the cited range.

The pyrazoline derivative comprising the component (C1) of the present invention can be synthesized by known methods. For example, this pyrazoline derivative can be obtained by the synthetic method described in Japanese Granted Patent Number 2,931,693 or by synthetic methods based thereon. For example, a specific benzaldehyde can first be condensed by a known condensation method with acetone or a specific acetophenone compound in the presence of a base in a water-alcohol mixed solvent. Or, a specific benzaldehyde compound and a specific acetophenone compound can be condensed in an organic solvent in the presence of a base catalyst, for example, piperidine. The chalcone compound yielded by these condensations can then be condensed by a known method with a specific hydrazine compound, for example, by reaction in acetic acid or an alcohol, to obtain the pyrazoline derivative according to the present invention.

The pyrazoline derivative comprising component (C1) of the present invention may also be acquired by purchase. 1-Phenyl-3-(4-tert-butylstyryl)-5-(4-tert-butylphenyl)pyrazoline (Nippon Chemical Works Co., Ltd.) is a commercially available component (C1).

The present inventors consider the co-use of the pyrazoline derivative comprising component (C1) with the other components to be one of the main factors that make it possible for the photosensitive resin composition of the present embodiment to achieve a satisfactorily high photosensitivity and resolution in direct imaging exposure.

Based on considerations of adhesiveness and sensitivity, the photosensitive resin composition of the present embodiment more preferably additionally contains a 2,4,5-triarylimidazole dimer or derivative thereof component (C2) as a photopolymerization initiator in addition to component (C1). The use of the abovementioned component (C2) is effective to further enhance photosensitivity and resolution.

The 2,4,5-triarylimidazole dimer can be specifically exemplified by 2-(o-chlorophenyl)-4,5-diphenylimidazole dimer, 2-(o-chlorophenyl)-4,5-di(methoxyphenyl)imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, and so forth. A single one of these or two or more of these in combination can be used as component (C2).

The blending proportion for the 2,4,5-triarylimidazole dimer or derivative thereof comprising component (C2) is preferably 0.1 to 20 mass parts, more preferably 0.5 to 10 mass parts, even more preferably 1 to 5 mass parts, and particularly preferably 3 to 5 mass parts, in each case per 100 mass parts of the total of components (A) and (B). Achieving the effects cited above for the addition of component (C2) to a satisfactory degree tends to be problematic when this blending proportion is less than 0.1 mass part, while exceeding 20 mass parts tends to impair the effects of the other components.

The following photopolymerization initiators may also be added to the photosensitive resin composition on an optional basis in addition to components (C1) and (C2): coumarin derivatives; benzophenone; N,N'-tetraalkyl-4,4'-diaminobenzophenones such as N,N'-tetramethyl-4,4'-diaminobenzophenone (Michler's ketone), N,N'-tetraethyl-4,4'-diaminobenzophenone, and so forth; aromatic ketones such as 2-benzyl-2-dimethylamino-1-(4-morpholinophenyl)butanone-1-one, 2-methyl-1-[4-(methylthio)phenyl]-2-morpholinopropan-1-one, and so forth; quinones such as alkylanthraquinones and so forth; benzoin ether compounds such as benzoin alkyl ethers and so forth; benzoin compounds such as benzoin, alkylbenzoins, and so forth; benzil derivatives such as benzil dimethyl ketone and so forth; acridine derivatives such as 9-phenylacridine, 1,7-bis(9,9'-acridino)heptane, and so forth; as well as N-phenylglycine, N-phenylglycine derivatives, and so forth.

In addition to the components described hereinabove, the photosensitive resin composition of the present embodiment preferably additionally contains leuco crystal violet. This makes it possible to achieve additional significant improvements in the balance between photosensitivity and resolution for the photosensitive resin composition of the present embodiment. Leuco crystal violet has the properties of a photodye in that it develops a particular color upon absorbing light, and it is believed that leuco crystal violet accomplishes the effect cited above for it based on this property.

Viewed from the perspective of achieving this effect more effectively, the blending proportion for the leuco crystal violet in the photosensitive resin composition of the present embodiment is preferably 0.01 to 10 mass parts and more preferably 0.05 to 5 mass parts, in each case per 100 mass parts of the total of components (A) and (B).

In addition to the components already described above, the photosensitive resin composition of the present embodiment may optionally contain other additives, e.g., dyes such as malachite green and so forth; photodyes other than leuco crystal violet, such as tribromophenyl sulfone; thermal discoloration inhibitors; plasticizers such as p-toluenesulfonamide and so forth; pigments; fillers; defoamers; flame retardants; stabilizers; adhesion promoters; leveling agents; stripping promoters; antioxidants; fragrances; imaging agents; and thermal crosslinkers, in each case at about 0.01 to 20 mass parts per 100 mass parts of the total of components (A) and (B).

The photosensitive resin composition of the present embodiment is preferably used to form a resist pattern by exposure to light having a peak in the wavelength range from at least 350 nm to less than 440 nm (more preferably 335 to 365 nm or 405 nm).

This light having a peak in the wavelength range from at least 350 nm to less than 440 nm may be a known light source, for example, a light source that effectively emits, for example, ultraviolet radiation or visible light, such as a carbon arc lamp, mercury vapor arc lamp, high-pressure mercury lamp, xenon lamp, Ar ion laser, semiconductor laser, and so forth.

Light sources that can be effectively used in the direct imaging technique described below can be exemplified by an argon gas laser emitting light at 364 nm, a solid UV laser emitting light at 355 nm, a gallium nitride-type blue laser emitting light at 405 nm, and so forth. The use of the gallium nitride-type blue laser is preferred thereamong from the perspective of being able to more easily form the resist pattern. In addition, a digital direct exposure instrument, for example, the "DE-1AH" (trade name) from Hitachi Via Mechanics, Ltd., may also be used.

Alternatively, with regard to light sourced from a mercury lamp, for example, a high-pressure mercury light, active light (for example, the h-line) can be used from which at least 99.5% of the light with a wavelength of not more than 365 nm has been cut. A filter for cutting the light with a wavelength of not more than 365 nm can be exemplified by the SCF-100S-39L (trade name) sharp cut filter from Sigma Koki Co., Ltd., and by the HG0405 (trade name) spectral filter from Asahi Spectra Co., Ltd.

The photosensitive resin composition as described hereinabove may be coated as a liquid resist on a metal surface, e.g., copper, a copper alloy, iron, an iron alloy, etc., and thereafter dried and then used, optionally after coating with a protective film, or it may be used for photolithography in the form of the photosensitive element described below.

A suitable embodiment of the photosensitive element of the present embodiment is shown in FIG. 1 in schematic cross section. The photosensitive element 1 shown in FIG. 1 is constituted of a support 10 and a photosensitive layer 14 disposed on the support 10. The photosensitive layer 14 comprises the photosensitive resin composition of the present embodiment as described above.

The thickness of the photosensitive layer 14 is not particularly restricted, but is preferably approximately 1 to 100 μm. In addition, a protective film may be coated on the photosensitive layer 14 on the side F1 opposite the support 10. This protective film can be exemplified by films of polyethylene, polypropylene, and so forth; preferably has an adhesive strength with the photosensitive layer 14 that is less than the adhesive strength between the support 10 and the photosensitive layer 14; and preferably is a low-fisheye film.

A film of, for example, polyethylene terephthalate, polypropylene, polyethylene, polyester, and so forth, can be suitably used as the support 10; its thickness is preferably 1 to 100 μm.

In addition to the support 10, photosensitive layer 14, and protective film as described above, a protective layer and/or an intermediate layer, e.g., a cushioning layer, adhesive layer, light-absorbing layer, gas barrier layer, and so forth, may additionally be disposed in the photosensitive element 1.

The photosensitive element 1 can be obtained, for example, by coating the photosensitive resin composition on the support 10 and then drying to form the photosensitive layer 14. Coating can be carried out by known methods, for example, a roll coater, comma coater, gravure coater, air knife coater, die coater, bar coater, and so forth. Drying can be carried out at 70 to 150° C. for about 5 to 30 minutes.

Coating of the photosensitive resin composition on the support 10 is preferably optionally carried out by the application of an approximately 30 to 60 mass % (as solids) solution comprising the photosensitive resin composition dissolved in a solvent such as, for example, methanol, ethanol, acetone, methyl ethyl ketone, methyl Cellosolve, ethyl Cellosolve, toluene, N,N-dimethylformamide, propylene glycol monomethyl ether, and so forth, or in a mixed solvent of the preceding. However, the amount of residual organic solvent in the photosensitive layer after drying is preferably brought to 2 mass % or less in order to prevent diffusion of the organic solvent in subsequent processes.

The obtained photosensitive element 1, either as such or after the additional lamination of the aforementioned protective film on the photosensitive layer 14, is then, for example, wound up on a cylindrical core and stored. This wind up is preferably carried out in such a manner that the support 10 faces to the outside. A plastic core can be suitably used as the core, for example, a core of polyethylene resin, polypropylene resin, polystyrene resin, polyvinyl chloride resin, ABS resin (acrylonitrile-butadiene-styrene copolymer), and so forth.

An end separator is preferably disposed at the end surfaces of the wound-up photosensitive element roll in order to protect the end surfaces, and a moisture-resistant end separator is preferably employed from the standpoint of the resistance to edge fusion. The wound-up photosensitive element roll is preferably packaged wrapped in a black sheet that has a low moisture permeability.

The method of the present embodiment for forming a resist pattern comprises a photosensitive layer formation step, in which a photosensitive layer comprising the above-described photosensitive resin composition of the present embodiment is formed on a substrate; an exposure step, in which a prescribed region of the photosensitive layer is exposed to light that has a peak in the prescribed wavelength range; and a development step, in which a resist pattern is formed by developing the exposed photosensitive layer.

More specifically, the method of the present embodiment for forming a resist pattern comprises a photosensitive layer formation step, in which a photosensitive layer comprising the above-described photosensitive resin composition of the present embodiment is formed on a substrate; an exposure step, in which a prescribed region of the photosensitive layer is exposed to light that has a peak in the wavelength range from at least 350 nm to less than 440 nm; and a development step, in which a resist pattern is formed by developing the exposed photosensitive layer. This method of forming a resist pattern is described in the following.

The above-described photosensitive element of the present embodiment can be suitably used in the photosensitive layer formation step. When the photosensitive element is employed, the protective film is removed (in those instances where the photosensitive element has a protective film) and the photosensitive layer, while being heated to about 70 to 130° C., is then laminated under reduced or ambient pressure onto the substrate by press-bonding at a pressure of about 0.1 to 1 MPa (about 1 to 10 kgf/cm$^2$) to form a photosensitive layer on the substrate. This substrate suitably takes the form of, for example, a copper-clad laminate comprising copper foil disposed on one or both surfaces of a layer comprising a dielectric material such as, for example, glass fiber-reinforced epoxy resin.

In the exposure step, light (active light) is irradiated on prescribed regions of the photosensitive layer laminated on the substrate wherein these prescribed regions correspond to the desired resist pattern. This exposure can be carried out by a mask exposure technique in which exposure is carried out through a mask pattern or by a direct imaging exposure technique such as laser direct imaging exposure, DLP exposure, and so forth, wherein a direct imaging exposure technique is preferred in terms of, inter alia, resolution. Known light sources can be used as the source of the active light, for example, light sources that effectively emit ultraviolet radiation or visible light, such as a carbon arc lamp, mercury vapor arc lamp, high-pressure mercury lamp, xenon lamp, Ar ion laser, semiconductor laser, and so forth.

A direct imaging technique is suitably used in this embodiment from the standpoints of high sensitivity and high resolution. Light sources that can be used in the direct imaging technique can be exemplified by an argon gas laser emitting light at 364 nm, a solid UV laser emitting light at 355 nm, a gallium nitride-type blue laser emitting light at 405 nm, and so forth. The gallium nitride-type blue laser is suitably used thereamong from the perspective of being able to more easily form the resist pattern. In addition, a digital direct exposure instrument, for example, the "DE-1AH" (trade name) from Hitachi Via Mechanics, Ltd., may also be used.

The use of the direct imaging technique makes it unnecessary to use a phototool to form the wiring pattern. In addition, the use of a sharp cut filter is also rendered unnecessary when the light source is a laser that emits light at the prescribed wavelength.

The light under consideration may be light from a light source that generates active light having a peak in the wavelength range from at least 350 nm to less than 440 nm or may be light adjusted, for example, by dispersion with a filter, in such a manner that a peak is in this wavelength range. The details of this light source are otherwise the same as the details provided above in the description of the photosensitive resin composition.

After exposure, the support on the photosensitive layer is removed when the support is present and a resist pattern is subsequently formed by development whereby the regions not subjected to photoexposure are removed, for example, by wet development using a developing solution, for example, an aqueous alkali solution, a water-based developing solution, organic solvent, and so forth, or by dry development. The development method is not particularly limited, and development can be carried out by such methods as, for example, dipping, spraying, brushing, slapping, and so forth.

The aqueous alkali solution used for development can be exemplified by 0.1 to 5 mass % aqueous sodium carbonate solutions, 0.1 to 5 mass % aqueous potassium carbonate solutions, 0.1 to 5 mass % aqueous sodium hydroxide solutions, and so forth. The pH of the aqueous alkali solution is preferably in the range from 9 to 11 and its temperature may be adjusted as appropriate in response to, for example, the solubility of the photosensitive layer. A surfactant, defoamer, organic solvent, and so forth may also be added to the aqueous alkali solution. The resin forming the resist pattern may as necessary be subjected to additional curing after the development step but prior to the formation of the conductor pattern; this additional curing may be effected by heating at about 60 to 250° C. or by photoexposure to about 0.2 to 10 J/cm$^2$.

In the method of the present embodiment for producing a printed wiring board, a printed wiring board is formed through a conductor pattern formation step in which a conductor pattern is formed on the aforementioned substrate based on the resist pattern formed as described above. The conductor pattern is formed by using the developed resist pattern as a mask and treating the unmasked, exposed copper foil regions by a known method, for example, etching, plating, and so forth. The plating method can be exemplified by copper plating, solder plating, nickel plating, gold plating, and so forth. Etching can be carried out using, for example, a cupric chloride solution, ferric chloride solution, basic etching solution, and so forth. The application of these methods enables the formation of a conductor pattern by the selective formation of a conductor layer in the trench regions (exposed regions of the substrate) in the resist pattern. Or, conversely thereto, a conductor layer can be selectively formed in those regions protected by the photosensitive layer that remains post-development.

After the etching or plating treatment, the photosensitive layer forming the resist pattern is stripped off, for example, using an aqueous solution more strongly alkaline than the alkali aqueous solution used for development, thus yielding a printed wiring board on which a specified conductor pattern has been formed. The strongly basic aqueous solution can be exemplified by a 1 to 10 mass % aqueous sodium hydroxide solution, a 1 to 10 mass % aqueous potassium hydroxide solution, and so forth. The technique used to strip off the photosensitive layer can be exemplified by immersion, spraying, and so forth.

Printed wiring boards, for example, multilayer printed wiring boards having small-diameter through holes, can be suitably produced using the production method described hereinabove.

Suitable embodiments of the present invention are described above, but the present invention is not limited to the preceding embodiments.

EXAMPLES

The present invention is described in additional detail by the examples that follow, but the present invention is not limited to these examples.

Examples 1 to 7 and Comparative Examples 1 and 2

<Preparation of Photosensitive Resin Composition Solutions>

The starting materials shown in Table 1, the component (C1) shown in Table 2 or 3, and the 4,4'-bis(diethylamino)benzophenone shown in Table 3 (abbreviated as EAB in Table 3) were intermixed to uniformity in the amounts shown in the respective tables to prepare solutions of photosensitive resin compositions according to Examples 1 to 7 and Comparative Examples 1 and 2. The following were used as component (C1): 1-phenyl-3-(4-methoxystyryl)-5-(4-methoxyphenyl)pyrazoline (abbreviated as PYR-M in Table 2), 1-phenyl-3-(4-isopropylstyryl)-5-(4-isopropylphenyl)pyrazoline (abbreviated as PYR-I in Table 2), and 1-phenyl-3-(4-tert-butylstyryl)-5-(4-tert-butylphenyl)pyrazoline (abbreviated as PYR-B in Table 3).

A higher solubility in solvent is desirable for the PYR-M, PYR-I, and PYR-B from the standpoint of bringing about a better balance between the sensitivity and resolution. A high solubility also facilitates preparation of the photosensitive resin composition solution and thus provides an excellent workability. The solubility of PYR-M, PYR-I, and PYR-B in 100 mL toluene solvent at 23° C. is shown in Table 4.

TABLE 1

| Starting material | | Blending quantity (g) |
|---|---|---|
| Component (A) | 2-methoxyethanol/toluene solution of methacrylic acid/methyl methacrylate/styrene (25/50/25 weight ratio, weight-average molecular weight: 55,000), acid number of the solids fraction: 163.1 mg KOH/g | 54 (solids) |
| Component (B) | EO-modified, bisphenol A skeleton dimethacrylate | 46 |
| Component (C2) | 2,2'-bis(o-chlorophenyl)-4,5-4',5'-tetraphenyl-1,2'-biimidazole | 3.7 |
| Color former | leuco crystal violet (LCV) | 0.5 |
| Dye | malachite green (MKG) | 0.03 |
| Solvent | acetone | 10 |
| | toluene | 7 |
| | N,N-dimethylformamide | 3 |
| | methanol | 3 |

TABLE 2

| | | Ex. 1 | Ex. 2 | Ex. 3 | Ex. 4 | Ex. 5 | Ex. 6 |
|---|---|---|---|---|---|---|---|
| Component (C1) | PYR-M addition (g) | 0.2 | 0.5 | 0.8 | — | — | — |
| | PYR-I addition (g) | — | — | — | 0.2 | 0.5 | 0.8 |
| Thickness of the photosensitive layer (μm) | | 25 | 25 | 25 | 25 | 25 | 25 |
| OD value (absorbance) | 365 nm | 0.52 | 0.73 | 1.00 | 0.48 | 0.68 | 1.00 |
| | 405 nm | 0.53 | 0.77 | 1.00 | 0.49 | 0.70 | 1.00 |
| Sensitivity (mJ/cm$^2$) | | 66 | 51 | 40 | 68 | 52 | 39 |
| Resolution (μm) | ST = 14/41 | 15 | 16 | 16 | 15 | 15 | 16 |
| | ST = 17/41 | 15 | 16 | 18 | 15 | 16 | 18 |
| | ST = 20/41 | 16 | 18 | 18 | 15 | 18 | 18 |

TABLE 3

| | | Comp. Ex. 1 | Comp. Ex. 2 | Example 7 |
|---|---|---|---|---|
| PYR-B addition (g) | | — | — | 0.2 |
| EAB addition (g) | | — | 0.4 | — |
| Thickness of the photosensitive layer (μm) | | 25 | 25 | 25 |
| OD value (absorbance) | 365 nm | 0.21 | 1.70 | 0.44 |
| | 405 nm | 0.13 | 0.52 | 0.45 |
| Sensitivity (mJ/cm$^2$) | | 557 | 120 | 95 |
| Resolution (μm) | ST = 14/41 | 16 | 20 | 15 |
| | ST = 17/41 | 18 | 18 | 16 |
| | ST = 20/41 | 20 | 20 | 20 |

TABLE 4

| | PYR-M | PYR-I | PYR-B |
|---|---|---|---|
| Solubility (g) | 3 | 20 | 5.2 |

<The Photosensitive Element>

The solutions prepared as described above of the photosensitive resin compositions of Examples 1 to 7 and Comparative Examples 1 and 2 were uniformly coated on 16 μm-thick polyethylene terephthalate films. The coated solution (film coating) was then dried for 10 minutes at 70° C. and 10 minutes at 100° C. using a hot-wind convection drier to give a photosensitive element in which a photosensitive layer comprising the aforementioned photosensitive resin composition was disposed on one side of the polyethylene terephthalate film functioning as a support. The film thickness of the photosensitive layer was 25 μm.

Figure 2:
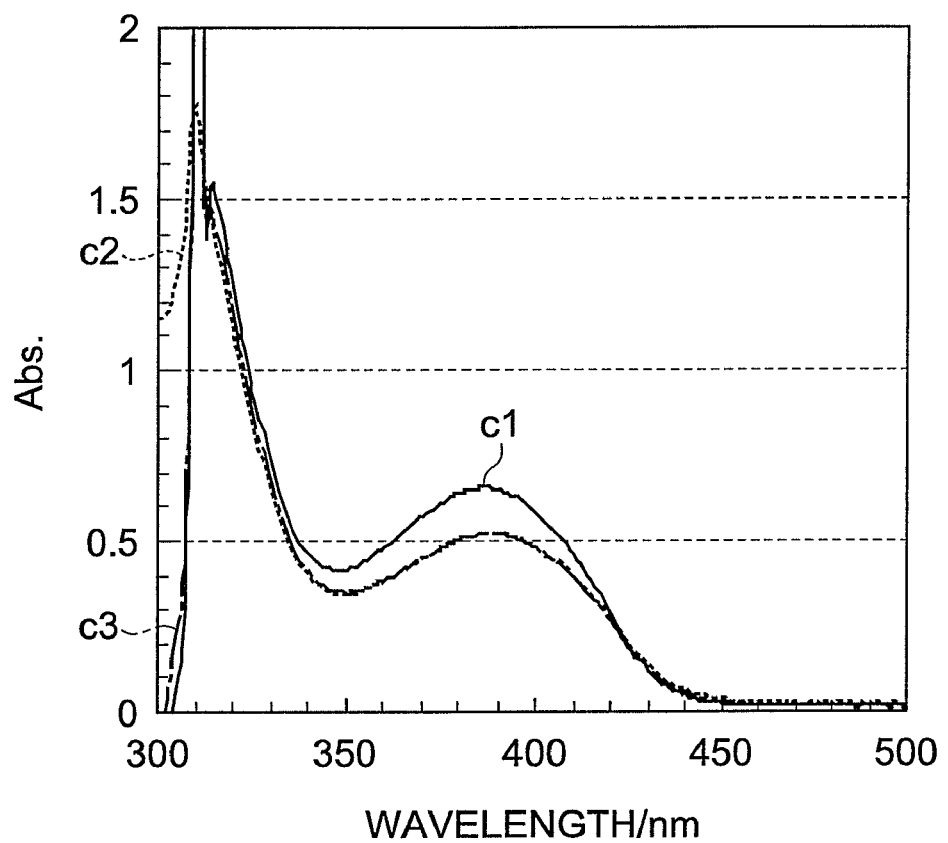
FIG. 2 shows the UV absorption spectra of photosensitive layers in accordance with examples of the present invention.
Figure 3:
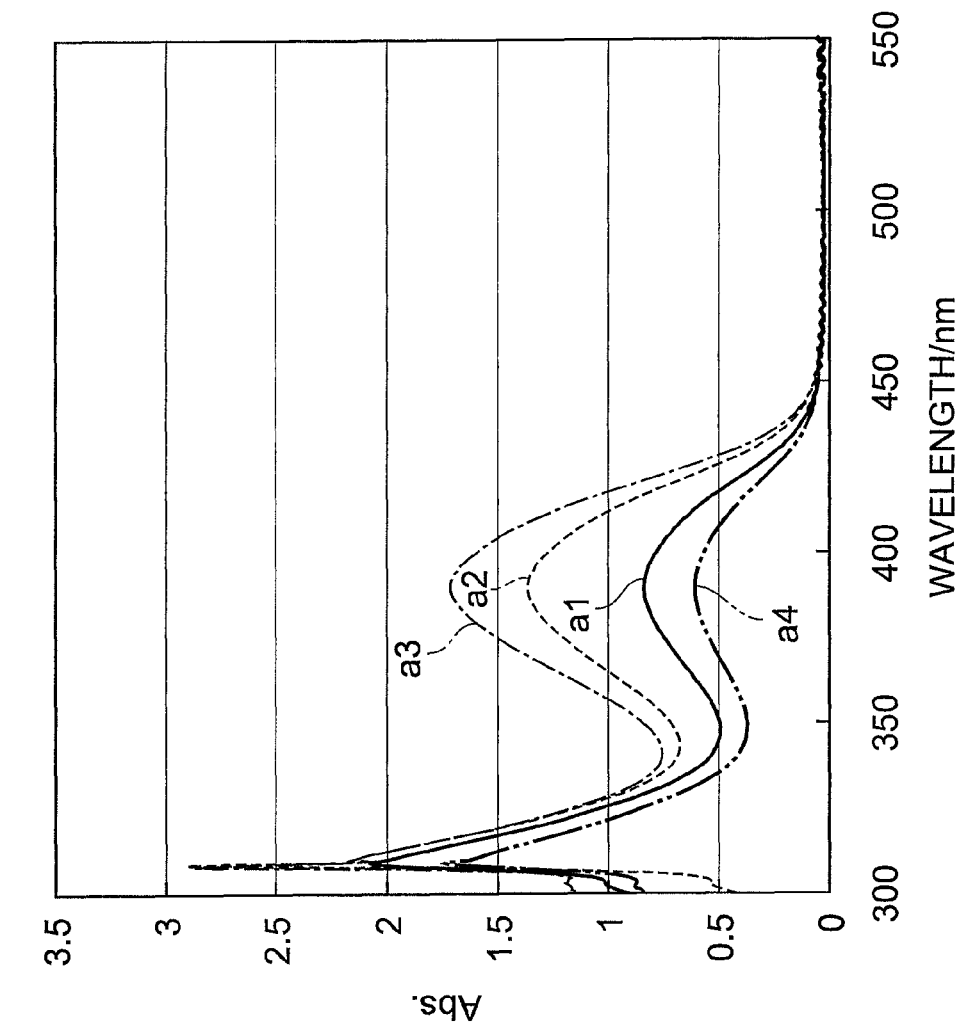
FIG. 3 shows the UV absorption spectra of photosensitive layers in accordance with examples of the present invention.
Figure 4:
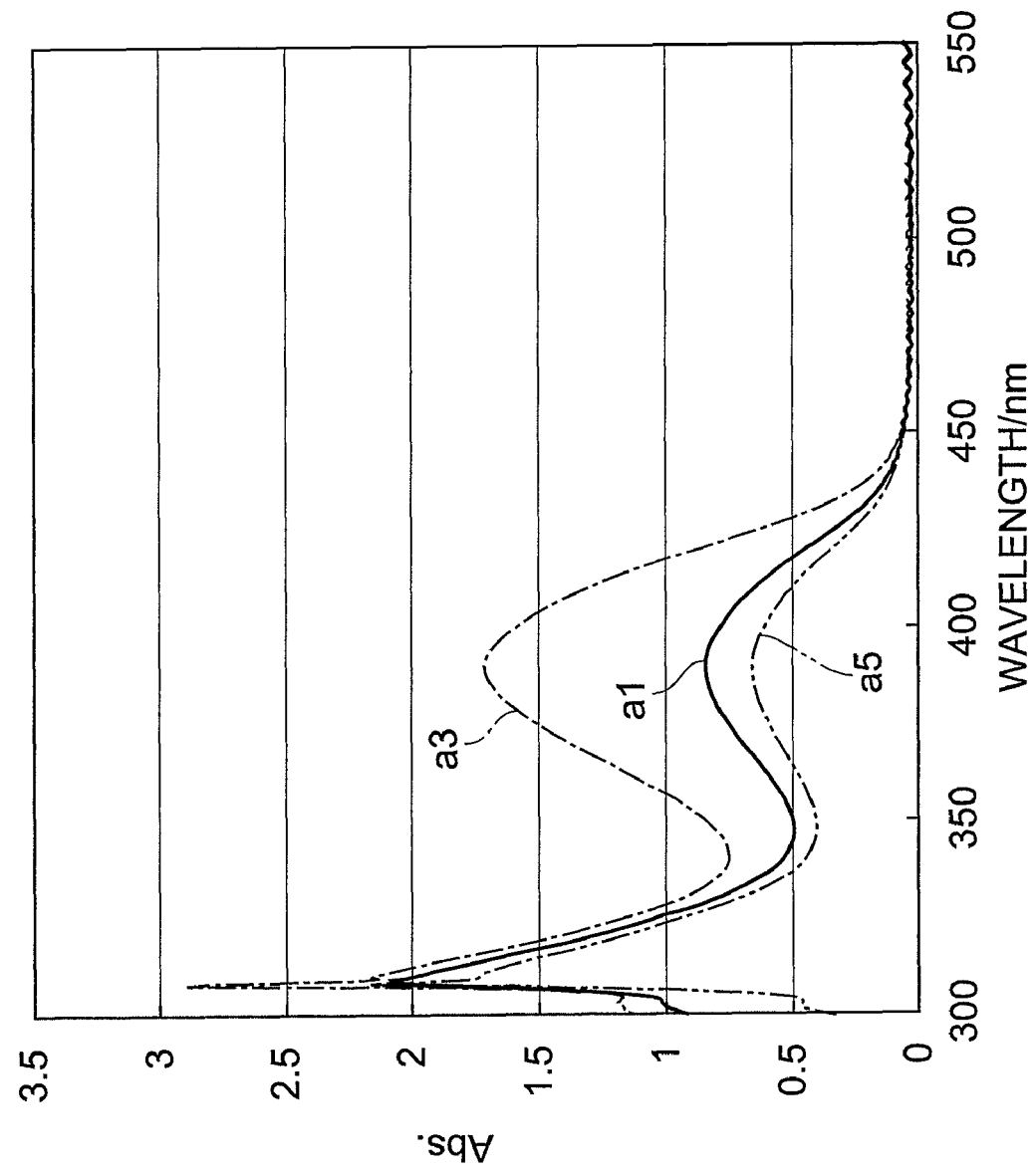
FIG. 4 shows the UV absorption spectra of photosensitive layers in accordance with examples of the present invention.
Figure 5:
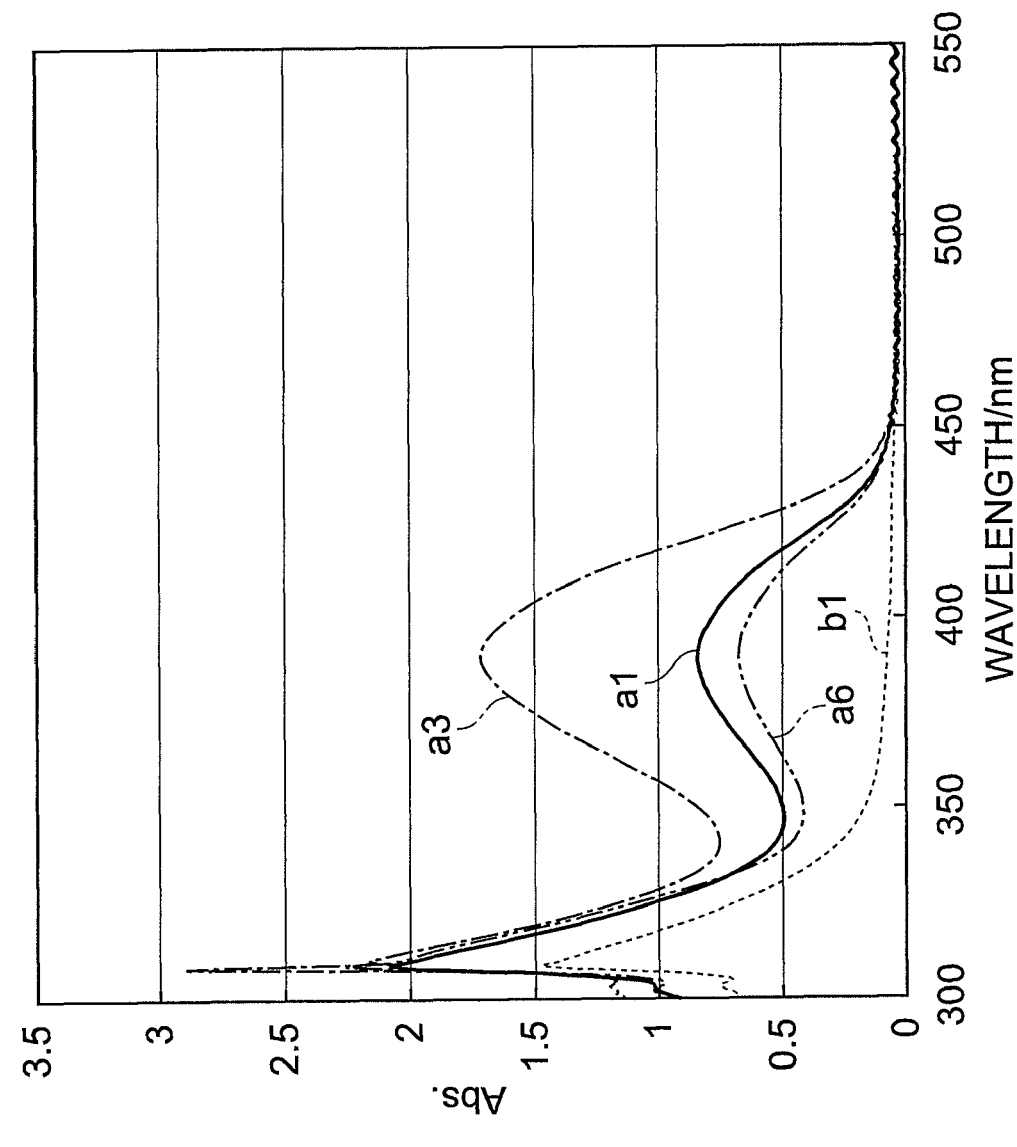
FIG. 5 shows the UV absorption spectra of photosensitive layers in accordance with examples of the present invention and comparative examples.
Figure 6:
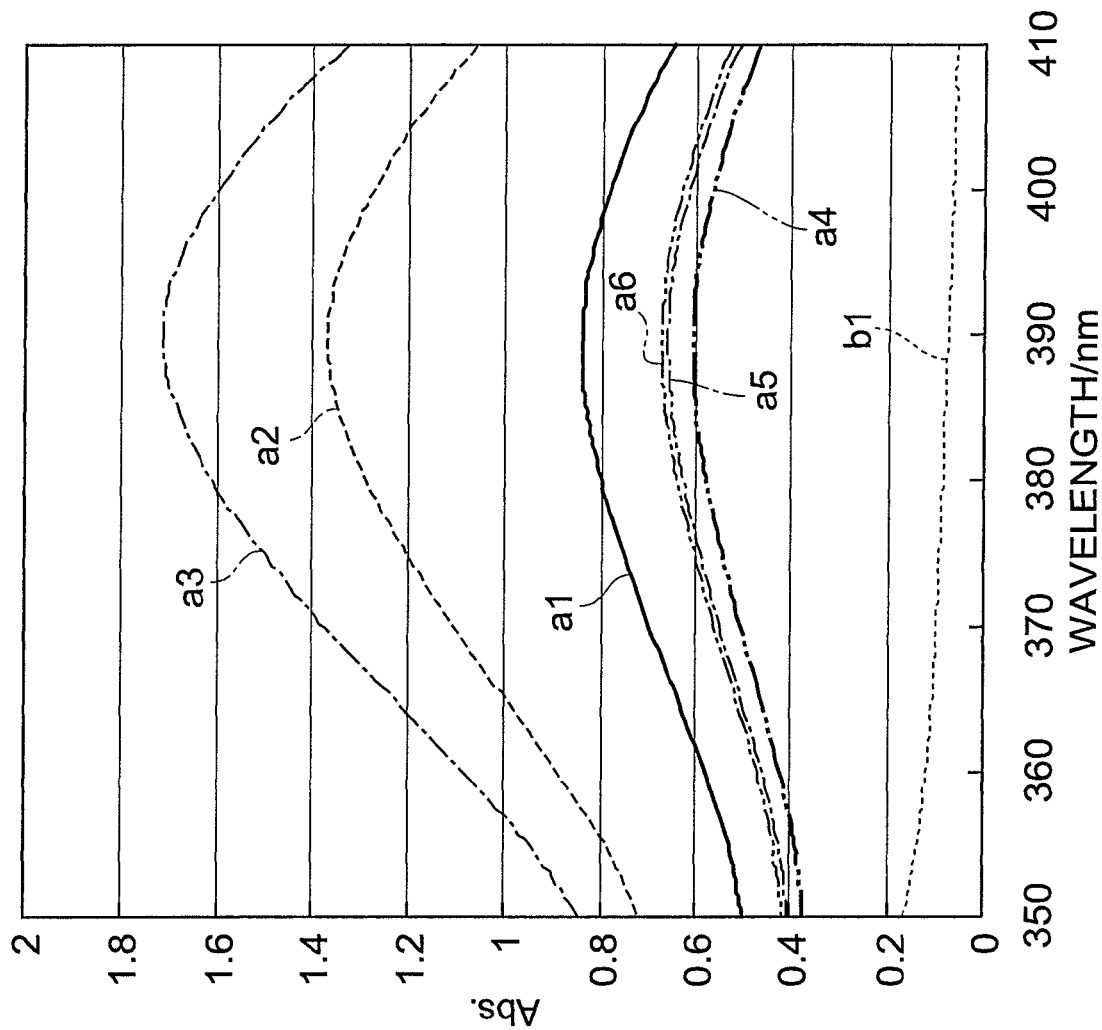
FIG. 6 shows the UV absorption spectra of photosensitive layers in accordance with examples of the present invention and comparative examples.

The optical density (OD value) of the photosensitive layer as a function of the incident light wavelength was measured using a UV spectrophotometer (a U-3310 spectrophotometer from Hitachi). The UV absorption spectrum was obtained by carrying out continuous measurement from 550 nm to 300 nm in absorbance mode using as reference the same type of polyethylene terephthalate film as used for the support; the value of the absorbance at 365 nm and 405 nm was used as the OD value at these wavelengths. The UV absorption spectra are shown in FIG. 2. In the figure, (c1) refers to the UV absorption spectrum for Example 1; (c2) refers to the UV absorption spectrum for Example 4; and (c3) refers to the UV absorption spectrum for Example 7. The (c2) and (c3) spectra in FIG. 2 are almost superimposed on one another in the wavelength range of approximately 340 to 420 nm. The absorbance in Examples 4 and 7 for incident light at 365 nm was 0.48 and 0.44, respectively, and for incident light at 405 nm was 0.49 and 0.45, respectively. The wavelength of maximum absorption (wavelength at which the absorbance passes through a maximum) in Example 1 (PYR-M), Example 4 (PYR-I), and Example 7 (PYR-B) was 385.2 nm, 386.2 nm, and 387.2 nm, respectively.

<Resist Pattern Formation>

A two-sided copper-clad laminate (MCL-E-67 (product name) from Hitachi Chemical Co., Ltd.) was prepared; this two-sided copper-clad laminate had copper foil (thickness=35 μm) laminated on both sides of a glass fiber-reinforced epoxy resin layer. The copper surface of this laminate was polished with a polisher (Sankei Co., Ltd.) fitted with a brush equivalent to #600 and was thereafter washed with water and dried in an air current. Then, while the two-sided copper-clad laminate was being heated to 80° C., the photosensitive element obtained as described above was pasted thereon in such a manner that its photosensitive layer side was adhered to the copper foil surfaces; this was followed by pressing at 0.4 MPa while heating to 120° C. Cooling to 23° C. then yielded a laminate comprising the photosensitive layer disposed on both surfaces of the two-sided copper-clad laminate.

The following were then laid in the sequence given on the surface of the polyethylene terephthalate film that was disposed as the outermost layer of the laminate: a phototool provided with a 41-step tablet and, as a negative for evaluation of the resolution, a phototool provided with a wiring pattern that had line width/space width=6/6 to 35/35 (unit: μm). The 41-step tablet on the phototool had a density range of 0.00 to 2.00 and a density step of 0.05; the tablet (rectangle) had a size of 20 mm×187 mm, and each step (rectangle) had a size of 3 mm×12 mm. An HG0405 (product name) spectral filter (bandpass filter that transmits light with a wavelength of 405 nm±30 nm) from Asahi Spectra Co., Ltd., was then placed on top of this stack.

This assembly was exposed, using a parallel light exposure instrument having a 5 kW short arc lamp as its light source (product name: EXM-1201, from Orc Manufacturing Co., Ltd.), to light in an amount such that the number of remaining steps after development of the 41-step tablet was 14, 17, or 20. The sensitivity was defined as the amount of light exposure at which the number of remaining steps after development of the 41-step tablet was 17. The irradiance of the light transmitted through the bandpass filter was measured using an accumulating UV light meter and a detector, and the amount of light exposure was defined as irradiance×exposure time. A UIT-150-A (product name, from Ushio Inc., also usable as an irradiance meter) was used as the accumulating UV light meter and a UVD-S405 (product name, sensitivity wavelength region: 320 nm to 470 nm, wavelength for calibrating absolute value: 405 nm) was used as the detector.

The polyethylene terephthalate film was then removed and development was carried out by spraying the uncovered photosensitive layer for 24 seconds at 30° C. with a 1.0 weight % aqueous sodium carbonate solution to remove those regions that had not been exposed to light. The resolution was defined as the smallest value of the line-to-line space width at which the regions not exposed to light could be cleanly removed, the lines did not meander, and void-free lines were produced. For the resolution and sensitivity as herein defined, smaller numerical values are indicative of better values.

The results of the above-described evaluations carried out on the photosensitive resin compositions of Examples 1 to 7 and Comparative Examples 1 and 2 are shown in Tables 2 and 3.

Examples 8 to 13 and Comparative Example 3

Solutions of the photosensitive resin compositions according to Examples 8 to 13 and Comparative Example 3 were prepared by mixing the starting materials shown in Table 5, the component (C1) shown in Table 6, and leuco crystal violet to homogeneity using the amounts shown in the tables. 1-phenyl-3-(tert-butylstyryl)-5-(4-tert-butylphenyl)pyrazoline (PYR-B in Table 3, Nippon Chemical Industrial Co., Ltd.) was used as component (C1). The maximum absorption wavelength $\lambda_{max}$ of this pyrazoline derivative (wavelength of maximum absorbance) was 387.2 nm.

TABLE 5

| | Starting material | Blending quantity (g) |
|---|---|---|
| Component (A) | 2-methoxyethanol/toluene solution of methacrylic acid/methyl methacrylate/styrene (25/50/25 weight ratio, weight-average molecular weight: 55,000), acid number of the solids fraction: 163.1 mg KOH/g | 54 (solids) |
| Component (B) | EO-modified, bisphenol A skeleton dimethacrylate | 46 |
| Component (C2) | 2,2'-bis(o-chlorophenyl)-4,5-4',5'-tetraphenyl-1,2'-biimidazole | 3.7 |

TABLE 5-continued

| | Starting material | Blending quantity (g) |
|---|---|---|
| Dye | malachite green (MKG) | 0.03 |
| Solvent | acetone | 10 |
| | toluene | 7 |
| | N,N-dimethylformamide | 3 |
| | methanol | 3 |

TABLE 6

| | | Example 8 | Example 9 | Example 10 | Example 11 | Example 12 | Example 13 | Comp. Example 3 |
|---|---|---|---|---|---|---|---|---|
| Blending quantity of component (C1) (g) | | 0.30 | 0.50 | 0.70 | 0.25 | 0.25 | 0.25 | — |
| Blending quantity of leuco crystal violet addition (g) | | 0.30 | 0.30 | 0.30 | 0.30 | 0.50 | 1.0 | 0.30 |
| Thickness of the photosensitive layer (μm) | | 25 | 25 | 25 | 25 | 25 | 25 | 25 |
| OD value (absorbance) | 365 nm | 0.673 | 0.998 | 1.229 | 1.202 | 0.504 | 0.515 | 0.063 |
| | 405 nm | 0.725 | 1.183 | 1.482 | 1.221 | 0.570 | 0.586 | 0.107 |
| Sensitivity (mJ/cm²) | | 94 | 71 | 63 | 83 | 83 | 75 | 557 |
| Resolution (μm) | ST = 14/41 | 18 | 25 | 25 | 14 | 18 | 16 | 35 |
| | ST = 17/41 | 16 | 18 | 20 | 16 | 20 | 18 | 30 |
| | ST = 20/41 | 16 | 18 | 20 | 16 | 25 | 20 | 30 |

<The Photosensitive Element>

The solutions of the photosensitive resin compositions according to Examples 8 to 13 and Comparative Example 3 prepared as described above were uniformly coated on 16 μm-thick polyethylene terephthalate film. The coated solution (coated film) was then dried for 10 minutes at 70° C. and 10 minutes at 100° C. using a hot-wind convection drier to give a photosensitive element in which a photosensitive layer comprising the photosensitive resin composition was disposed on one side of the polyethylene terephthalate film functioning as a support. The film thickness of the photosensitive layer was 25 μm.

The optical density (OD value) of the photosensitive layer as a function of the incident light wavelength was measured as in Examples 1 to 7 and Comparative Examples 1 and 2 using a UV spectrophotometer (a U-3310 spectrophotometer from Hitachi). The UV absorption spectra are shown in FIGS. 3 to 6. (a1) refers to the UV absorption spectrum for Example 8; (a2) refers to the UV absorption spectrum for Example 9; (a3) refers to the UV absorption spectrum for Example 10; (a4) refers to the UV absorption spectrum for Example 11; (a5) refers to the UV absorption spectrum for Example 12; (a6) refers to the UV absorption spectrum for Example 13; and (b1) refers to the UV absorption spectrum for Comparative Example 3.

<Resist Pattern Formation>

Proceeding as in Examples 1 to 7 and Comparative Examples 1 and 2, a laminate in which the photosensitive layer was disposed on both sides of the two-sided copper-clad laminate was first obtained. Then, again proceeding as in Examples 1 to 7 and Comparative Examples 1 and 2, the following were laid in the sequence given on the surface of the polyethylene terephthalate film that was disposed as the outermost layer of the laminate: a phototool provided with a 41-step tablet and a phototool provided with a prescribed wiring pattern. An HG0405 (product name) spectral filter (bandpass filter that transmits light with a wavelength of 405 nm±30 nm) from Asahi Spectra Co., Ltd., was then placed on top of this stack.

This assembly was exposed to light as in Examples 1 to 7 and Comparative Examples 1 and 2. The sensitivity was defined as the amount of light exposure at which the number of remaining steps after development of the 41-step tablet was 17. The irradiance of the light transmitted through the band-pass filter was measured as before using an accumulating UV light meter and a detector, and the amount of light exposure was defined as irradiance×exposure time.

The polyethylene terephthalate film was then removed and development was carried out by spraying the uncovered photosensitive layer for 24 seconds at 30° C. with a 1.0 weight % aqueous sodium carbonate solution to remove those regions that had not been exposed to light. The resolution was defined as the smallest value of the line-to-line space width at which the regions not exposed to light could be cleanly removed, the lines did not meander, and void-free lines were produced. For the resolution and sensitivity as herein defined, smaller numerical values are indicative of better values.

The post-development resist shape was inspected using an S-500A scanning electron microscope from Hitachi. It is desirable for the resist to have an approximately rectangular shape.

The results of the above-described evaluations carried out on the photosensitive resin compositions of Examples 8 to 13 and Comparative Example 3 are shown in Table 6.

INDUSTRIAL APPLICABILITY

The present invention provides a photosensitive resin composition that has the ability to form a resist pattern by direct imaging exposure and to do so at a satisfactory sensitivity and resolution; the present invention also provides a photosensitive element that uses this photosensitive resin composition, a method of forming a resist pattern using this photosensitive resin composition, and a method of producing a printed wiring board using this photosensitive resin composition.

What is claimed is:

1. A photosensitive resin composition comprising:
   (A) a binder polymer having a weight-average molecular weight of 40,000 to 80,000;
   (B) a photopolymerizable compound that has an ethylenically unsaturated bond; and
   (C1) a compound represented by general formula (1) below,

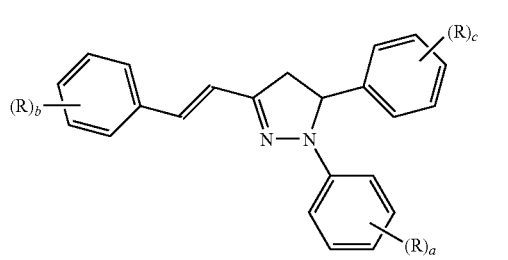

wherein, at least one R represents a $C_{1-10}$ alkoxy group; the sum of a, b, and c is 1 to 6; and when the sum of a, b, and c is 2 to 6, each R may be the same as or different from one another.

2. The photosensitive resin composition according to claim 1, wherein the content of the component (C1) is 0.05 to 0.8 mass parts per 100 mass parts of the total content of the components (A) and (B).

3. The photosensitive resin composition according to claim 1, wherein the component (A) comprises an acrylic-type polymer that has as constituent units thereof a monomer unit derived from acrylic acid and/or methacrylic acid and a monomer unit derived from an alkyl ester of acrylic acid and/or an alkyl ester of methacrylic acid.

4. The photosensitive resin composition according to claim 1, wherein the component (B) comprises a (meth)acrylate compound that contains a bisphenol skeleton.

5. The photosensitive resin composition according to claim 1, further comprising (C2) a 2,4,5-triarylimidazole dimer or a derivative thereof.

6. The photosensitive resin composition according to claim 5, wherein the content of the component (C2) is 3 to 5 mass parts per 100 mass parts of the total content of the components (A) and (B).

7. The photosensitive resin composition according to claim 1, wherein the R is a methoxy group.

8. The photosensitive resin composition according to claim 1, wherein the sum of a, b, and c is 1 or 2.

9. The photosensitive resin composition according to claim 1, that is used to form a resist pattern by exposure to light having a peak in the wavelength range from at least 350 nm to less than 440 nm.

10. The photosensitive resin composition according to claim 1, wherein the wavelength of maximum absorption by component (C1) is at least 370 nm to less than 420 nm.

11. A photosensitive element comprising a support and a photosensitive layer that is provided on said support, and that comprises the photosensitive resin composition according to claim 1.

12. A method of forming a resist pattern, comprising:
   forming a photosensitive layer comprising the photosensitive resin composition according to claim 1, on a substrate;
   exposing prescribed regions of the photosensitive layer to light that has a peak in the wavelength range from at least 350 nm to less than 440 nm; and
   developing the exposed photosensitive layer to form a resist pattern.

13. The method of forming a resist pattern according to claim 12, wherein the exposing is carried out by a direct imaging exposure technique.

14. A method of producing a printed wiring board, comprising:
   forming a photosensitive layer comprising the photosensitive resin composition according to claim 1, on a substrate;
   exposing prescribed regions of the photosensitive layer to light that has a peak in the wavelength range from at least 350 nm to less than 440 nm;
   developing the exposed photosensitive layer to form a resist pattern; and
   forming a conductor pattern on the substrate based on said resist pattern.

15. The method of producing a printed wiring board according to claim 14, wherein the exposing is carried out by a direct imaging exposure technique.

16. The photosensitive resin composition according to claim 3, wherein the component (A) also has as constituent units thereof a monomer unit derived from styrene.

* * * * *